United States Patent [19]
Smith et al.

[11] Patent Number: 6,014,030
[45] Date of Patent: Jan. 11, 2000

[54] CURRENT-LEVEL MONITOR WITH HIERARCHICAL PRECISION

[75] Inventors: Gregory J. Smith; David J. Kunst; Paul M. Henry, all of Tucson, Ariz.

[73] Assignee: National Semiconductor Corp., Santa Clara, Calif.

[21] Appl. No.: 09/053,864

[22] Filed: Mar. 30, 1998

Related U.S. Application Data

[63] Continuation-in-part of application No. 08/643,210, May 3, 1996, abandoned.

[51] Int. Cl.$^7$ .................................................... G01R 27/08
[52] U.S. Cl. .......................... 324/705; 324/600; 324/713; 320/128; 320/164
[58] Field of Search .................... 324/425, 426, 324/433, 444, 435, 600, 705, 713; 320/128, 162, 132, 102, 134, 163, 164

[56] References Cited

U.S. PATENT DOCUMENTS

| | | | |
|---|---|---|---|
| 5,530,335 | 6/1996 | Decker | 320/102 |
| 5,554,919 | 9/1996 | Uchida | 320/132 |
| 5,721,480 | 2/1998 | Morioka | 320/134 |
| 5,736,832 | 4/1998 | Seragnoli | 320/128 |

*Primary Examiner*—Josie Ballato
*Assistant Examiner*—Thomas Valone
*Attorney, Agent, or Firm*—Thomas L. Bohan

[57] ABSTRACT

Current-level monitoring circuitry incorporating a full-time coarse monitor and a part-time fine monitor and capable of generating control signals when the current-level being monitored reaches certain predetermined thresholds. In its preferred embodiment the invention is incorporated into battery-protection circuitry, guarding against both excess charging currents and excess discharging currents. A key concept of the invention is a hierarchical monitoring system incorporating a full-time coarse monitor that activates the fine monitor only when the battery current level enters a certain range and then deactivates it once the level falls out of that range again. Should the current level continue to rise up to the threshold of unsafe battery current, the fine monitor will disconnect the battery. In the preferred embodiment of the invention, the fine monitor operates by comparing, with a predetermined reference voltage, the voltage drop across a fine sensing resistor through which battery current is directed. The fine sensing resistor may be a precision resistor or it may be the same resistance used by the coarse monitor. The reference voltage is established in a way that permits a differing disconnect threshold to be set depending on the battery current polarity and in such a way that it changes with temperature so as to largely offset the temperature dependence of the sensing resistors. The present invention utilizes a single fine comparator for monitoring both battery-charge and battery-discharge, thereby providing high accuracy without the need for an additional fine comparator with its high space and power demands.

20 Claims, 8 Drawing Sheets

CURRENT-LEVEL MONITOR WITH HIERARCHICAL PRECISION

This application is a Continuation-in-Part of parent application Ser. No. 08/643,210, filed on May 3, 1996, now abandoned.

BACKGROUND OF THE INVENTION

1. Field of the Invention

The present invention relates to circuitry for current-level monitoring and for generating a control signal whenever the monitored current level reaches one of several predetermined threshold values. More particularly, the present invention relates to circuitry used for protecting a rechargeable battery against both excess charging currents and excess discharging currents and to isolating such a battery during the time that the battery is not required to power a load. More particularly yet, the present invention relates to current-monitoring circuitry that provides an improvement in the precision with which predetermined current threshold levels can be sensed, without a concomitant increase in the average power demand. Most particularly, the present invention relates to current-monitoring circuitry that remains in a low-power, coarse-precision mode until the current level being monitored approaches a predetermined threshold, at which point the current-monitoring circuitry of the present invention shifts into a high-precision mode, where it remains until either a disconnect (trip) level is reached or the current level falls back below the threshold, and the circuitry shifts back into its coarse mode.

2. Description of the Prior Art

Rechargeable battery technology has gained widespread attention with the increasingly widespread use of portable electronic equipment such as laptop computers, portable CD players, camcorders, and cellular phones. As portability demands grow along with system complexity, the pressure for battery technology improvements increases. At present, the battery technology forefront is focused on batteries made up of lithium-ion (Li+) cells, because of the great improvement in specific energy (energy/mass) availability that such batteries offer over the older nickel-based battery technology. Unfortunately, the improvement the Li+ batteries provide in specific energy is somewhat offset by the susceptibility that these new batteries display to electrical over-stress. This electrical over-stress includes overcharging and over-discharging the battery and excess current to or from the battery. This susceptibility means that Li+-based battery packs must be equipped with circuitry to protect the battery against these stresses. There must be voltage-sensing protective circuitry that will disconnect the battery whenever the voltage across it has fallen to a critical value (e.g., while the battery is powering a load) and whenever the voltage across the battery has risen to a (different) critical level (e.g., while the battery is being charged). Similarly, there must be current-sensing protective circuitry that will isolate the battery whenever the charging current or load-driving current reaches a predetermined high value. The present invention is directed to the latter type of protective circuitry, that designed for protecting the battery against excessive current, be it charging or discharging. (Although the current to be monitored is referred to as a current that is either charging the battery or used to drive a load, it is to be understood that the currents of interest are not limited to these. For example, the battery especially needs to be protected against the extremely high discharge current that occurs when the load is shorted out and also against the extremely high charging current that can result from an charging source being applied to the battery.)

There is a premium placed on the accuracy with which the current level is measured. If the current-monitoring technique is known to have a large uncertainty, then in order to ensure that the battery is protected, it will be necessary to be very conservative in setting the disconnect threshold. E.g., if it is known that $I_{crit}$ is the maximum current level that can be drawn from the battery without damage to the battery, and it is further known the circuitry monitoring the current level can only determine that level within $\pm\Delta$, then the protection circuit will have to be designed so that it disconnects the battery from the load whenever the current being drawn from the battery reaches a level $I_{crit}-\Delta$. Depending on the size of $\Delta$, this can result in a large number of unnecessary disconnects, and all of the inconvenience that results, for example, from the abrupt powering down of a camcorder or a laptop computer while it is in use. An additional detriment arising from the crudeness with which the prior art can track the battery current (charging or discharging) is that to allow for possibly large battery currents various of the semiconductor devices in the circuit, especially power transistors, must be over-designed to be on the safe side. In particular, metal-oxide-semiconductor field-effect-transistors (MOSFETs) must be designed to have a larger area than would normally be necessary, just to provide for the contingency of an abnormally high current due to the crude protective circuitry greatly underestimating battery current. Having to allocate additional circuit real estate (as the result of inaccurate current monitoring) is a significant drawback when circuit space is at a premium, as is normally the case with portable equipment.

The usual way of monitoring a current level involves converting the current into a corresponding voltage, and then monitoring that voltage. If, as in the present case, the objective is to cause some action to be taken when the monitored current reaches a critical value, then a comparator can be used to compare the corresponding voltage with a predetermined threshold voltage (reference voltage) corresponding to the critical current. Although many variations can be made on the comparator inputs in order to determine exactly which pair of voltages the comparator is to compare, the comparator's basic function is to provide a binary output, the instantaneous value of which depends on whether the "test" voltage is greater than or less than the reference voltage. The comparator sensitivity is a measure of how small of a differential between the reference voltage and the test voltage is necessary to cause a shift from one output state to the other. All other things being equal, this sensitivity will be proportional to the current driving the comparator. The cost of increased comparator sensitivity is increased power consumption. The other limit on accuracy and precision is the resistance used to convert the current-to-be-monitored into a voltage. Two major sources of error to be considered are (1) the temperature dependence of that resistance (2) the manufacturing vagaries that lead to variations from one chip to the next of the as-manufactured resistance in comparison with the design resistance. Depending on the type of device used to provide the resistance, yet other sources of inaccuracy or imprecision may arise.

Figure 1:
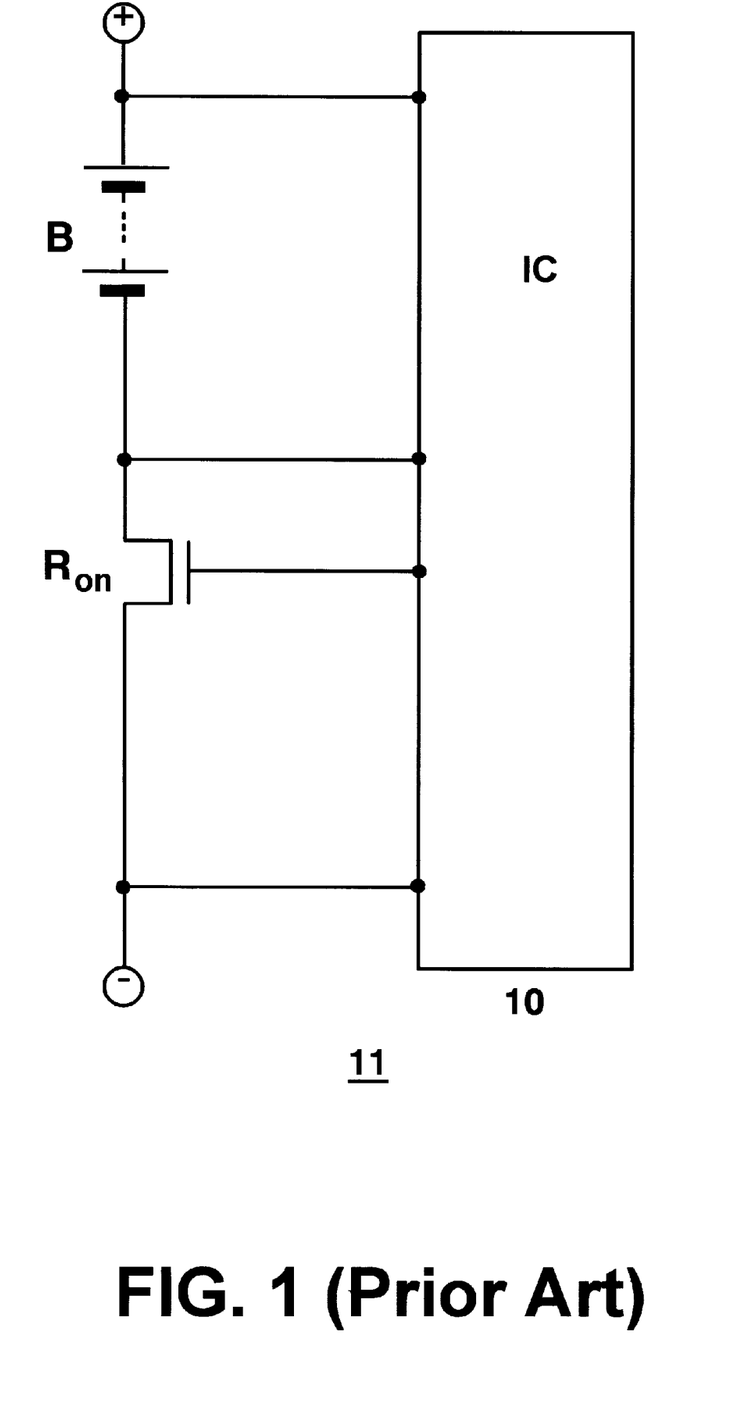
FIG. 1 (Prior Art) is a diagram of a prior-art current detector for use in a battery-protection circuit, showing an ideal power MOSFET as the regulator/detection device.
Figure 2:
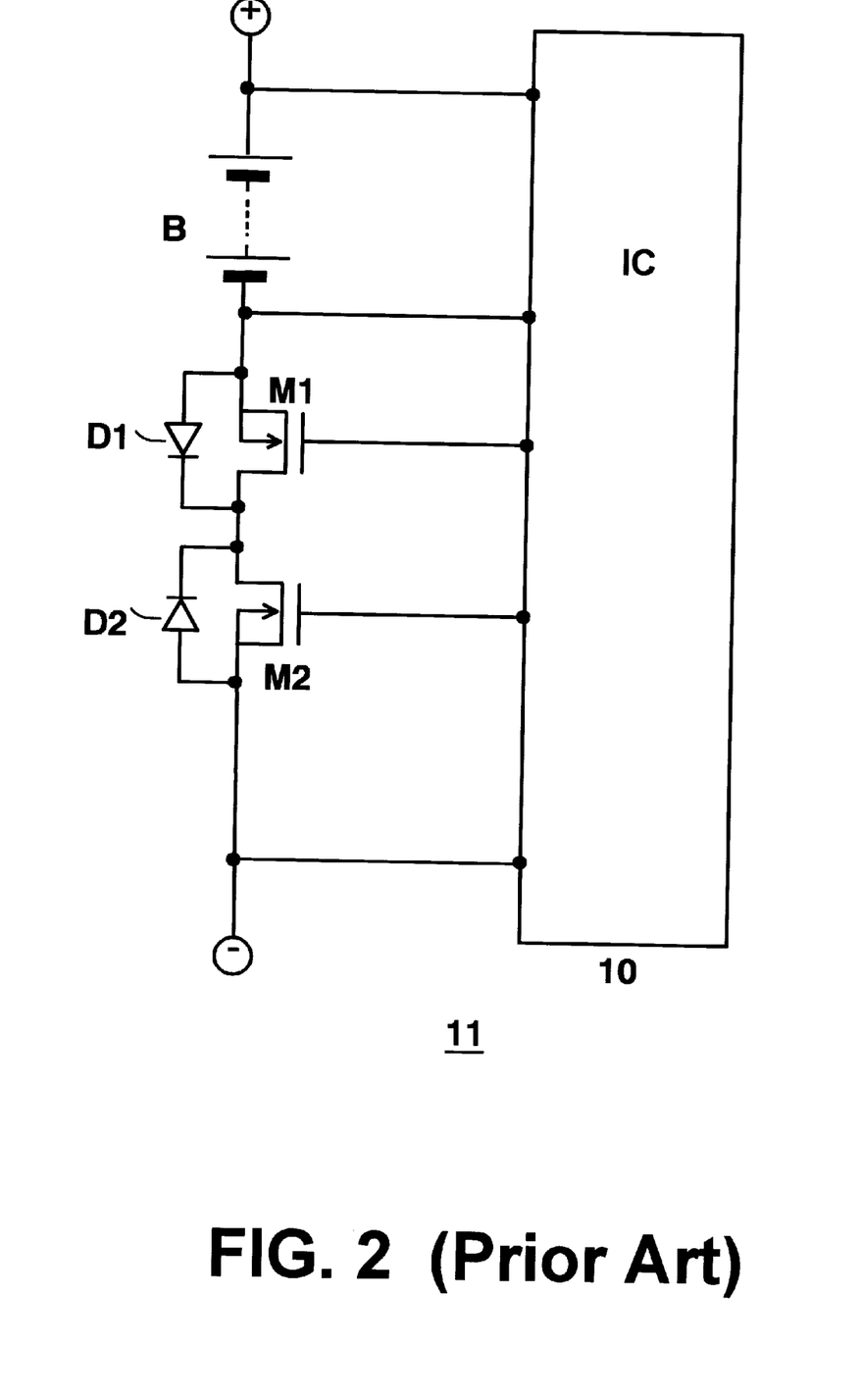
FIG. 2 (Prior Art) is a diagram of the prior art of FIG. 1 showing a more realistic schematic for the power MOSFETs.

In the prior art current-monitoring battery-protective circuits, the resistance used to convert the battery current to a voltage is that of a MOSFET in its "on" state, that is, $R_{on}$, the source/drain resistance of a conducting MOSFET. See, for example, FIG. 1 (prior art) for a schematic illustration of this. The block labeled "IC" contains the comparator circuitry used to isolate the battery—represented schematically as the single cell "B"—when the discharging current reaches a critical level. (It appears that none of the prior art devices provided for monitoring battery-charging current, but rather just battery-discharging current.) FIG. 2 shows that the prior art actually uses two power MOSFETs, M1 and M2, connected drain-to-drain. Through circuitry—not shown—leading to their respective gates the prior art turns on one or the other of these MOSFETs. The back-to-back diodes, D1 and D2, shown in FIG. 2 shunting the two MOSFETs are the body diodes associated with the respective transistors. Since it possible to fabricate the two MOSFETs to be so close to one another as to be practically identical, the current-to-voltage conversion factor—$R_{on}$, the source/drain resistance of the conducting MOSFET—will be the same regardless of polarity of the current and thus it would have been straightforward to take the extra step so as to be able to use this type of circuit to monitor and protect against charging currents as well as discharging currents.

There are several drawbacks to the prior-art approach to the current-monitoring task. One is the amount of power that must be used in the comparators in order to have an accurate comparison between the voltage drop across $R_{on}$ and the predetermined threshold voltage. In addition fine comparators, by their nature, take up significant space on the chip. This is a serious problem, since, in the applications of interest here, there is a demand for ever-smaller chips. One approach within the context of the prior art that addresses both of these problems—excess power and space requirements—is to use coarse comparators instead of fine. This introduces problems that are even worse, since the circuit needs to compensate for the relative lack of sensitivity in determining the magnitude of the current being monitored. The fact is that no comparator is ideal; it is only the ideal comparator that responds (by changing its binary output) as soon as a monitored voltage becomes greater than the reference voltage by an infinitesimal amount. Real comparators will change output state when the monitored voltage exceeds the reference voltage by an amount Δ. Thus, to perform its protective function, disconnecting the battery when the current reaches a critical threshold, $I_{crit}$, i.e., when the monitored voltage reaches a corresponding critical voltage Vcrit, the comparator must be set to disconnect the battery when the monitored voltage reaches a level $V_{crit}$-Δ. A "fine" comparator will require a relatively small Δ and a "coarse" comparator will require a relatively large Δ.

The drawbacks of working with a relatively large A (coarse comparator(s)) is that in order to ensure that the battery is protected it will in general have to be disconnected at currents far below those that would damage the battery, as discussed earlier.

In addition to having to choose between fine comparators, with their high space and power demands, on the one hand and insensitive coarse comparators on the other, the prior-art circuits suffer from temperature dependence and Vgs dependence during operation, because of the variation of the MOSFET resistance, Ron, used as the sensing resistor. This further increases the "Δ" safety buffer that must be built into the circuit, thereby increasing the number of unnecessary shut-downs.

Another problem, though of lesser importance, with the prior art battery-protective circuit is the fact that the base value of Ron will vary from chip to chip due to manufacturing vagaries. This fact requires yet an additional increment to be added to the safety buffer. In the prior-art circuit the totality of these effects can result in deviations of as much as 30% between the design $R_{on}$ and actual $R_{on}$.

Although the excess-current concerns have been described up to this point as if the safe range was the same regardless of polarity (i.e., regardless of whether the current was charging the battery or powering the load), this is not always the case. It is occasionally useful to be able to set a different disconnect threshold for battery-charging currents than is set for battery-discharging currents. The prior-art designs, in addition to being burdened with a less-than-desirable means of monitoring current, also appear to be limited in selecting different disconnect levels for the two current polarities. It would appear that within the context of the prior art, the only way in which these different levels can be set is to use two different comparator circuits, with the additional space and power demands that that entails.

Of course, one is not limited to dependence on the resistance across a conducting MOSFET. It is possible to use passive elements, the resistances of which can be tightly controlled, especially when they are provided with a trimming mechanism. Thus, a more accurate current-monitoring-and-response circuit can be introduced. Unfortunately, it cannot be introduced as a replacement to the less accurate monitor described above; the power MOSFETs and associated circuitry are necessary for, among other purposes, the isolation of the battery from the rest of the circuit when conditions call for this isolation. Consequently, adding the additional monitor in order to refine the current control places additional current demands on the battery. Although these additional demands are minuscule by most standards, involving only a fraction of a microamp of additional current to be drawn from the battery, it is quite significant in the present context, where the total current demand on the batteries will be only a few microamps.

Therefore, what is needed is a current-monitoring circuit that more exactly measures current, a circuit that functions with less dependence on operating temperature and gate/source voltages than does the present current-monitoring circuitry. What is also needed is such current-monitoring circuitry that can easily establish and act upon different disconnect-threshold levels for charging and discharging currents, respectively. What is also needed is such a circuit that is independent of manufacturing vagaries with respect to MOSFET resistances. Finally within this context, what is needed is such current-monitoring circuitry that does not significantly increase the power demand over that required by the present current-monitoring circuitry used to protect rechargeable portable batteries.

SUMMARY OF THE INVENTION

By employing a novel, hierarchical approach to current-level monitoring, the present invention provides a more sensitive means of monitoring current levels and of carrying out protective actions than does the prior art. Furthermore, the circuit of the present invention permits different critical-current threshold levels to be set depending on the polarity of the current being monitored. In addition, the circuit of the present invention allows a number of operational variables to be compensated for. These include temperature dependence and gate-source variations in employed MOSFETs. One embodiment of the present invention uses a passive precision resistor as the fine sensing resistor, thereby eliminating the need to take account of any uncertainty in the MOSFET "on-resistance" resulting from chip-manufacturing vagaries. By utilizing the coarse current-level monitor to monitor battery current polarity, the present invention can also provide for different disconnect-thresholds for charging and discharging currents, respectively, while using a single fine monitor.

Figure 3:
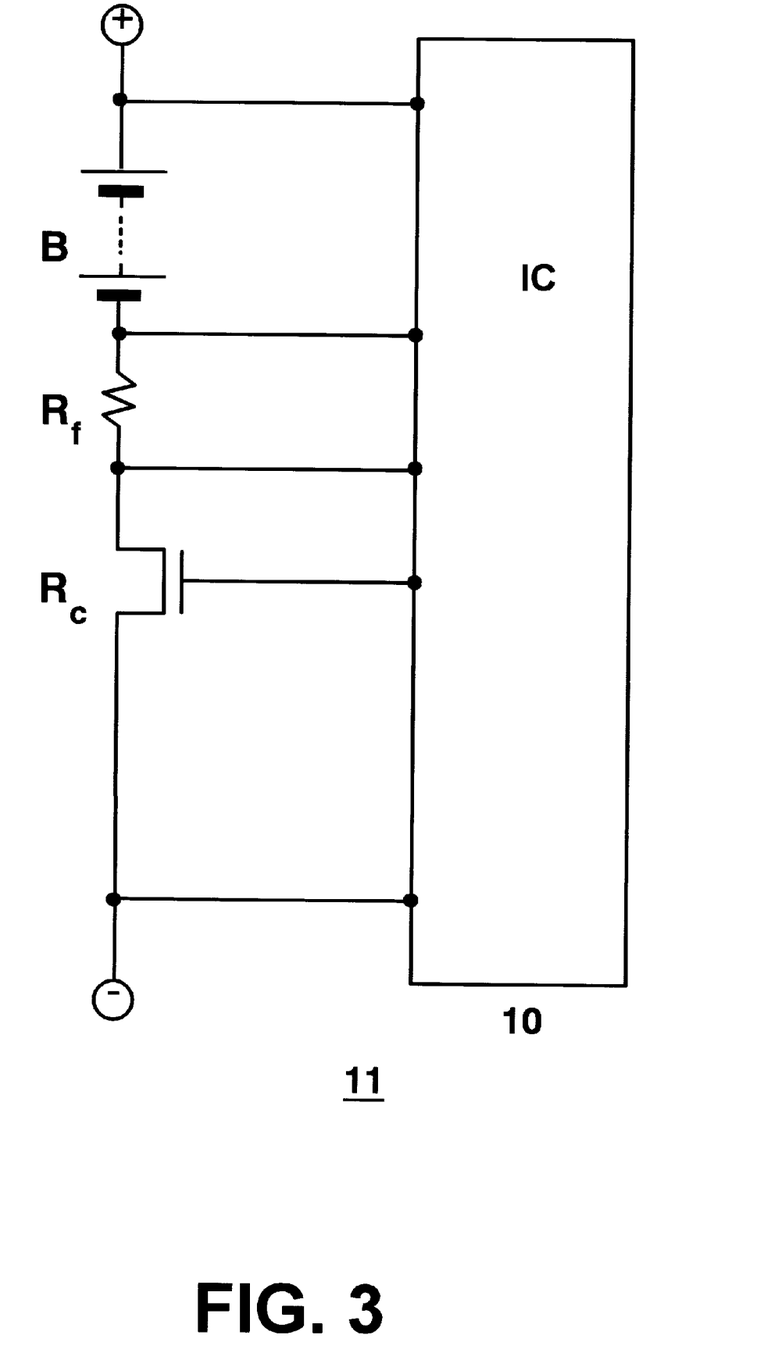
FIG. 3 is a simplified schematic of the present invention, indicating the dual-monitor nature of the battery-protective circuit of the present invention by the presence two different sensing resistors, one for the coarse and the other for the fine monitor.

FIG. 3 shows the general idea of the present invention. As with the prior art, the coarse monitor is based on the source/drain resistance of the MOSFETs through which the battery current is connected to a load or to a charging source, respectively. Because the MOSFETs are coupled back-to-back, the body diodes of the two buck one another and the two-MOSFET module can be depicted by a single idealized MOSFET M, with an "on" resistance $R_c$, the resistance used by the coarse monitor. The leads shown in FIG. 3 leading from the two sides of the MOSFET M to the IC 10 are connected to the coarse monitor circuitry contained on the IC 10. With continuing reference to FIG. 3, it can be seen that a second resistor, $R_f$, is in series with the battery current. Leads from the high and low side of resistor $R_f$ are connected to the fine monitor contained on IC 10. Although FIG. 3 suggests that the resistor $R_f$ used with the fine monitor is distinct from the MOSFET on-resistance $R_c$ used with the coarse monitor, this is not necessarily the case. In general the resistor $R_f$ can be any resistor through which the battery current or a fixed fraction of the battery current passes. One such resistor is $R_c$, the on-resistance of the MOSFET M. What is key to the circuit of the present invention is that the fine monitor be more sensitive than the coarse monitor and that it incorporate means to compensate for operating temperature.

Because it is only being used for roughly determining the current range (though exactly determining its polarity), the coarse monitor comparator can be allowed to have a relatively low responsiveness, which means that it can be small in area and operated at a relatively low power. The function of the coarse monitor, in addition to determining current polarity, is to cause the activation of the fine monitor whenever the current being monitored gets to within some fraction of the maximum safe battery current, say 50%. Control is then passed over to the fine monitor, so that the battery can be isolated should the current level come very close to the maximum safe battery current. This can be done by turning "off" the MOSFET M or by any other means used to interrupt the current flow to or from the battery B. As soon as the current falls again to within the range for which the coarse monitor can safely exercise control, the fine monitor is de-activated, minimizing the power consumed by the battery-protection circuitry.

As stated above, the coarse monitor, in addition to regulating operation of the fine detector, also monitors the direction of the current and provides this information to the fine monitor so that a single fine monitor can be used to accurately protect against both overcharge and overdischarge, another example of how the circuit of the present invention minimizes the power required to control the battery current while avoiding unnecessary turn-offs.

This coarse/fine pairing of comparators provides an order of magnitude accuracy improvement over the prior approach that depended on the resistance of the conducting MOSFETs to detect unsafe battery current levels. This is because of the much higher precision of the fine comparator; however, without the hierarchical approach, it would be impossible to take advantage of this high precision, because of the large power dissipation associated with fine comparators. Indeed to obtain the voltage resolution necessary and the robustness that makes for a dependably functioning monitor, the current bias of the fine comparator needs to be approximately 100 times the level of the (barely-alive) coarse comparator. Hence, with the latter at the level of 0.2 to 0.4 microamps, the former will be drawing 20 to 40 microamps while on. It can thus be seen why it is essential to have the fine comparator "on" time minimized.

Through clocking circuitry outside the scope of the present invention, the PREFERRED EMBODIMENT of the present invention permits an over-current (i.e., a battery current in excess of its nominal maximum safe level) to exist for about 4 ms before a disconnect is effected (by a control signal generated by the fine monitor). This allows for high transient currents that will not by themselves damage the battery. However, if both the maximum current and maximum time limits are reached, then the battery is disconnected from the circuit. The coarse monitor is then used to determine when the operating conditions are again safe for the battery to be reconnected.

BRIEF DESCRIPTION OF THE DRAWINGS

FIG. 5b shows the differential/equivalent circuit to that of FIG. 5a.

DESCRIPTION OF THE PREFERRED EMBODIMENT

The Two-Mode Current-Monitoring Method

Figure 4A:
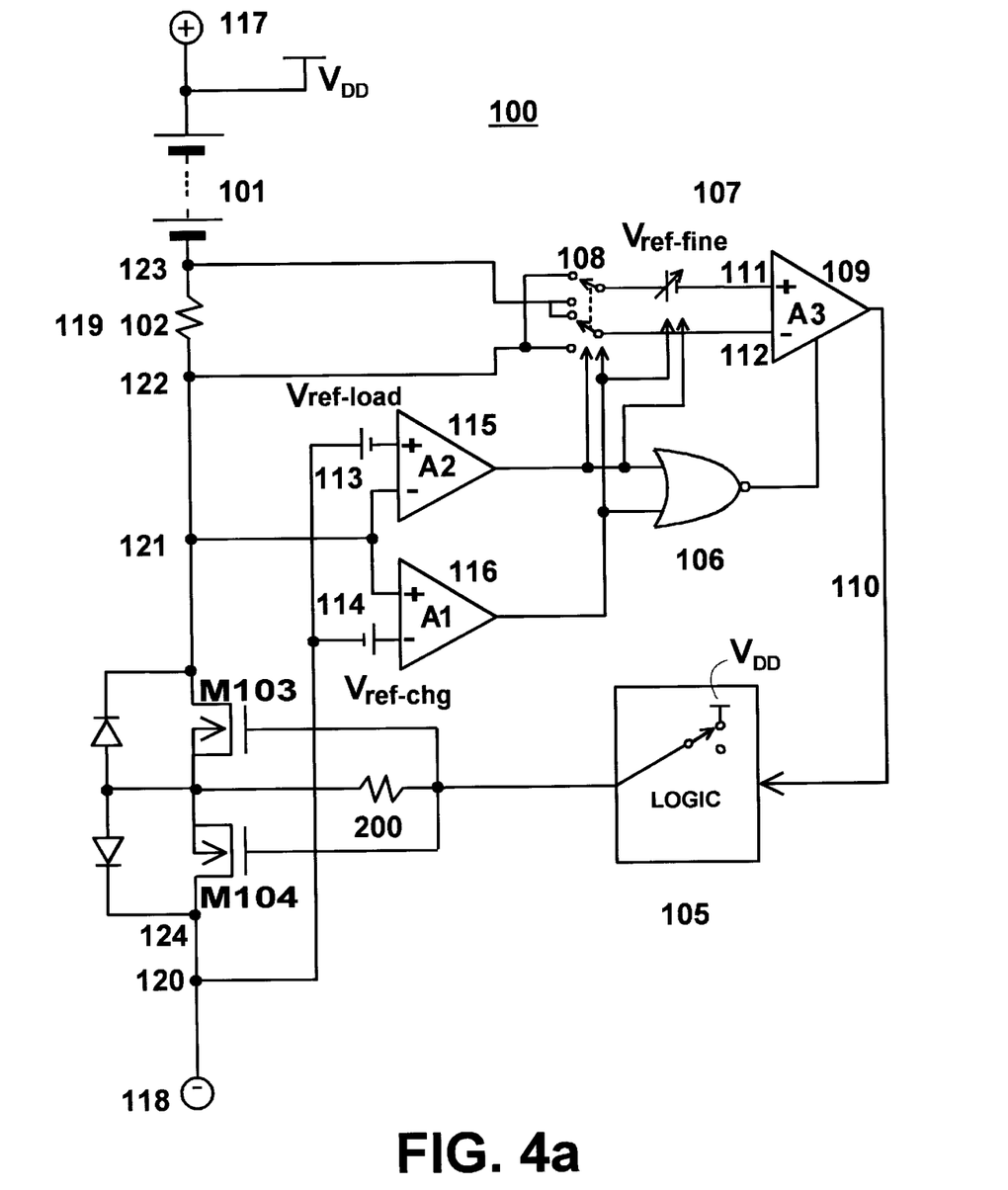
FIG. 4a is a diagram showing the key elements of one version of the PREFERRED EMBODIMENT of present invention, that version where the sensing resistor of the fine monitor is a passive resistor separate from the MOSFET resistor, the sensing resistor of the coarse monitor.

FIG. 4a shows a schematic 100 representing one version of the PREFERRED EMBODIMENT of the present invention. The peripheral circuitry associated with incorporating this circuit into a practical battery-protecting circuit is within the skill of one conversant with the art.

FIG. 4a includes a battery 101 that in general will be composed of a number of individual cells, connected either in series, as shown here, or in parallel. This battery 101 is what powers a load (not shown) that is connected across positive terminal 117 and negative terminal 118. With a load so connected and powered, the battery current will flow along the branch 119 in a direction such that the higher voltage end of the branch 119 will be at the negative terminal 118. That is, while the battery 101 is powering a load, the voltage level due to the resultant battery current will monotonically decrease from terminal 118 to node 123, the negative terminal of the battery 101.

With continuing reference to FIG. 4a, it can be seen that when the battery 101 is being charged, an external voltage (current) source (not shown) will be attached such that the positive terminal of the external source will be attached to the positive terminal 117 of the circuit 100 and the negative terminal of the external source will be attached to the negative terminal 118 of the circuit 100. During the charging of the battery 101, the current flow will be in a direction such that the lower voltage end of the branch 119 will be at the negative terminal 118. That is, while the battery 101 is being charged, the voltage level due to the charging current will monotonically increase from terminal 118 to node 123, the negative terminal of the battery 101.

Note the power transistors M103 and M104 through which battery current must pass, be it from the battery (while a load is being powered) or to the battery (while the battery is being recharged). These power transistors M103 and M104 provide the means to disconnect the battery 101 from the circuit. In the variant of the PREFERRED EMBODIMENT depicted in FIG. 4a, both power MOSFETs M103 and M104 are either on hard—to permit battery current to flow—or off hard, to interrupt the battery current, i.e., to disconnect the battery from the circuit. A distinction from the prior art is that in the PREFERRED EMBODIMENT of the present invention the two power transistors in the current line are connected source-to-source rather than drain-to-drain, as in the prior art. When the MOSFETs are connected source-to-source, the body diode effects cancel and the pair can be depicted as a single ideal—no body diode—MOSFET.)

With continuing reference to FIG. 4a, it is noted that the coarse monitor of the present invention—apart from the fact that it contains two comparators and is capable of monitoring both battery-charging and battery-discharging current—is somewhat similar to the current monitor of the prior art, in that it depends on the voltage drop across the power transistors, M103 and M104, while they are "on." In the case of the PREFERRED EMBODIMENT, this is the IR drop due to the battery current (charging or discharging) passing across source-to-drain resistance of the two "on" transistors, i.e., across $2R_{on}$. In complete distinction from the prior art, the circuit of the present invention just uses this coarse monitor to sense the direction of the battery current and to activate a fine monitor when the battery current rises to some predetermined fraction of the safe level. The heart of the coarse monitor is the pair of comparators A1 and A2 as shown in FIG. 4a. Note that in the case of comparator A1 the inverting input has in series with it a reference voltage $V_{ref-chg}$. It can be seen that this increases the voltage input to the inverting terminal of comparator A1 by an amount $V_{ref-chg}$. Similarly, the voltage at the non-inverting terminal of comparator A2 is decreased by an amount $V_{ref-load}$.

Fine comparator A3 is part of the fine monitor. It is activated by the signal coming from the NOR gate 106 as shown in FIG. 4a. A logic high signal from the NOR gate 106 powers down fine comparator A3 and a logic low signal powers up (activates) fine comparator A3. Thus, it can be seen that when and only when both coarse comparator A1 and coarse comparator A2 are outputting a logic low signal will fine comparator A3 be deactivated. If either of the coarse comparators is outputting logic high then fine comparator A3 will be activated. (This would also be true if both coarse comparators are outputting logic high; however, in the instant circuit this will be seen to be something that does not occur.)

When the battery is powering a load (with MOSFET M103 and M104 both conducting) the voltage at node 120 is always higher than the voltage at node 121. The higher the battery current the higher is the potential of node 120 with respect to that of node 121. At very low load currents, however, the difference is not as great as $V_{ref-load}$. Thus for low load currents the non-inverting input of coarse comparator A2 is lower than the inverting input and as a consequence the output of comparator A2 is logic low. Eventually, as the load current increases, the voltage drop from node 120 to node 121 will exceed $V_{ref-load}$ and at that point the output of comparator A2 will switch to logic high. Note that with the same conditions (load current, i.e., battery discharging), coarse comparator A1 will output a logic low regardless of the battery current magnitude. The net result is that when the battery is powering a load, the fine comparator A3 is activated when and only when the voltage from node 120 to node 121 exceeds $V_{ref-load}$, i.e. when the battery current magnitude exceeds $V_{ref-load}/2R_{on}$.

Performing a similar analysis for current with the opposite sense (so that the battery is being charged), it can be seen that the fine comparator A3 is activated only when the battery current magnitude exceeds $V_{ref-chg}/2R_{on}$.

The two referenced voltages associated with the coarse comparators A1 and A2 will be set to values reflecting battery currents some fraction (say, 50%) of the maximum safe current. These coarse comparators thus can be very coarse indeed, with small gain. There is in fact not much to the two coarse comparators of the present invention. As a consequence they are much cheaper than two fine comparators but are good enough to get their job done. As can be seen, because of the two different reference voltages at this stage, situations where the maximum safe charging current is different from the maximum safe discharging current can be addressed. The reference voltages can be generated by any of a number of means. The particular approach used in the PREFERRED EMBODIMENT is set up later in this section.

A key difference between the circuit shown in FIG. 4a and other variants on the PREFERRED EMBODIMENT is the fact that the fine monitor is shown using a sensing resistor 102 that is distinct from the sensing resistance used by the coarse monitors. In this particular variant, fine sensing resistor 102 is a precision passive resistor. In the PREFERRED EMBODIMENT, this resistive element 102 is fabricated from the copper alloy used in the leadframe of the battery-encapsulation case. Made to have an 8 mil by 8 mil cross-section and a length that ensures its resistance is on the order of 4 mΩ, the precision resistor 102 of the PREFERRED EMBODIMENT is found to vary by about 20% from batch to batch. Nevertheless, standard trimming techniques (e.g., by EEPROM) allow this range to be readily reduced to 5%. This is also its maximum variation in its resistance over a current range from approximately 0.5 A up to approximately 20 A. Furthermore, it is found to be able to handle 60 A current pulses up to 6 msec in duration.

As a function of temperature, the precision resistor of this variant of the PREFERRED EMBODIMENT varies by approximately 3000 ppm per °C. (i.e., per K). As can be seen from FIG. 4a, when the battery is powering a load, the potential at node 122 will be higher than the potential at node 123 by an amount equal to the IR drop across precision resistor 102, i.e., $R_f I_{bat}$ where $R_f$ is the resistance of precision resister 102 and $I_{bat}$ is the magnitude of the battery current. Similarly, when the battery is being charged, node 122 will be at a voltage $R_f I_{bat}$ below node 123.

An additional feature of the fine monitor is the switch 108 by which the voltage across the precision resistor 102, the fine voltage, is delivered to the inputs of fine comparator A3. When the battery current is powering a load, and the current has reached the level where the coarse monitor has activated the fine comparator A3, the switch will be placed in the "up" configuration (see FIG. 4a). This connects the (high side) node 122 to the non-inverting input of the fine comparator A3 and the (low side) node 123 to the inverting input of fine comparator A3. Only when the IR drop across precision resistor 102 exceeds $V_{ref-fine}$ will fine comparator A3 output a logic high signal. Prior to that, its output will be logic low. The box 105 labeled "LOGIC" in FIG. 4a contains the logic necessary to convert a logic high signal from fine comparator A3 to an output that turns off power MOSFETs M103 and M104. This corresponds to the "open" switch position, which allows the gate-source voltage to collapse to zero by means of the gate-source resistor 200, as shown. Otherwise the LOGIC box 105 outputs a gate signal to MOSFETs M103 and M104 that maintains them both in the conducting state. This corresponds to the switch position that ties the gates to the top of the battery stack, $V_{DD}$.

When the battery is being charged and the current level exceeds the first threshold, the coarse monitor places switch 108 in the "down" position, connecting node 122 to the inverting input of fine comparator A3, and node 123 (now the high side node with respect to precision resistor 102) to the noninverting input of fine comparator A3, through the reference voltage $V_{reffine}$. As long as the battery current does not reach its disconnect point (for which $I_{bat} R_f$ equals $V_{ref-fine}$), A3 outputs a logic low, ensuring that the gates of power MOSFETs M103 and M104 are tied to $V_{DD}$ and hence that MOSFETs M103 and M104 continue to conduct. When $I_{bat}$ reaches $V_{reffine}/R_f$, however, the output of fine comparator A3 switches to logic high causing the switch in LOGIC 105 to connect the gates to an open pole, thus allowing the gate-source voltage on both power MOSFETs to collapse to zero through resistor 200. This shuts off the power MOSFETs M103 and M104, thereby disconnecting and so protecting the battery.

The reference voltage in the non-inverting line of fine comparator A3 is shown in FIG. 4a as a variable voltage $V_{ref-fine}$. This indicates in the context of this invention that this reference can take on any one of several discrete predetermined voltages. In the PREFERRED EMBODIMENT, it can take on one of two different values, one associated with the critical charging current level and the other with the critical discharging current level. The arrows going to this voltage symbol from the coarse monitor indicate that the choice of which $V_{ref-fine}$ to use is determined by the coarse monitor on the basis of the polarity of the battery current.

Figure 4B:
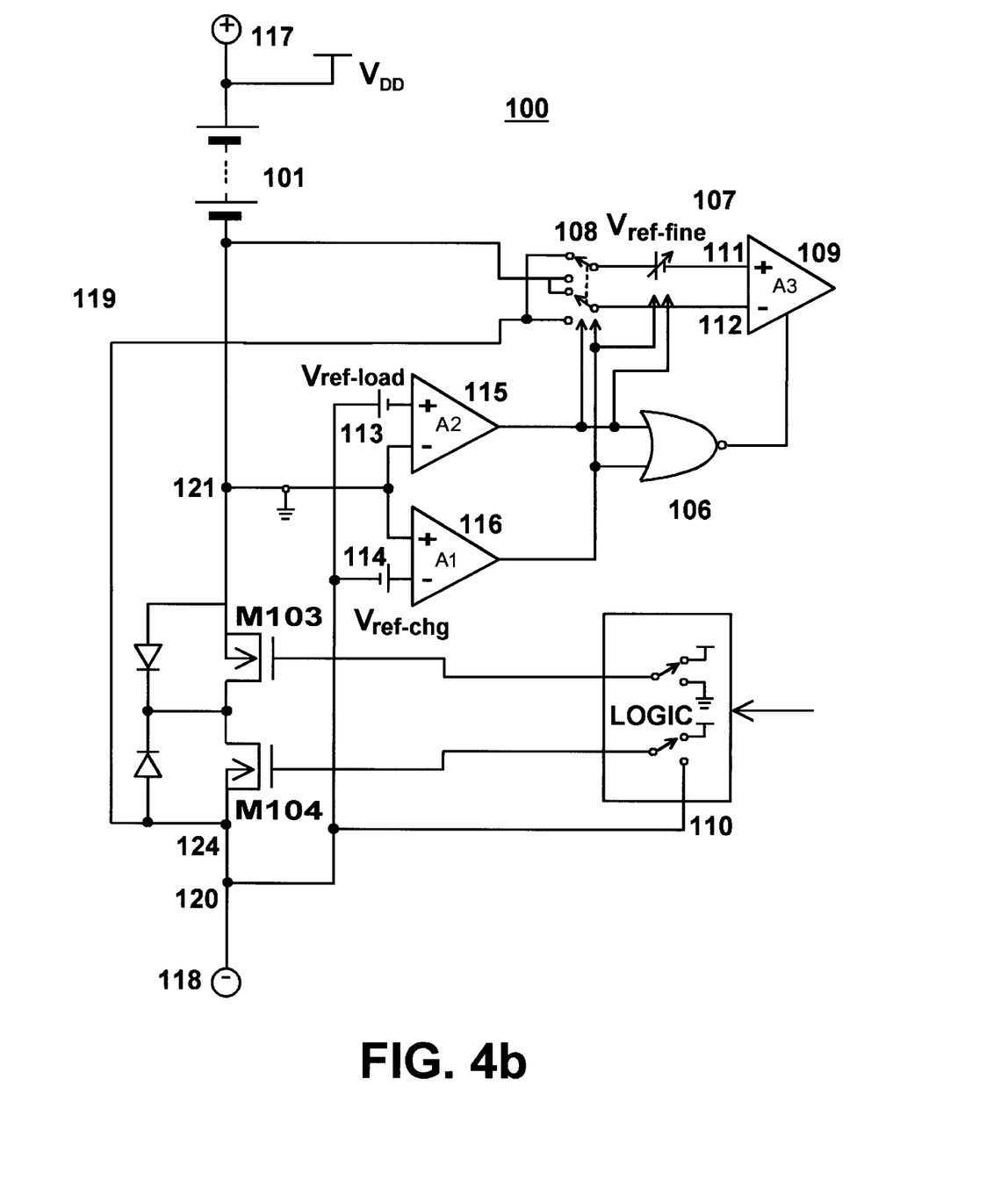
FIG. 4b shows the version of the PREFERRED EMBODIMENT of the present invention in which the sensing resistor of the fine monitor is the same as the sensing resistor for the coarse monitor.

FIG. 4b shows a variation on the PREFERRED EMBODIMENT of the present invention. Now, instead of using a precision passive resistor in connection with the fine monitor, this circuit uses the same sensing resistor for both the coarse and the fine monitoring, namely the "on" resistance of the power MOSFETs M103 and M104. This resistance is coupled to the fine monitor by means of the latter's connection through switch 108 to upper node 123 and lower node 124, as shown in FIG. 4b. Also note that the power MOSFETs M103 and M104 are now provided with the capability of being turned on and off independently of one another, as is shown by the LOGIC 110 depicted in FIG. 4b. LOGIC 110 is controlled by the output of fine comparator A3, such that a logic-high output from fine comparator A3 causes MOSFET M103 to be "on" and MOSFET M104 to be off, and conversely for a logic-low output from comparator A3. Also depicted in FIG. 4b is switch 108 configured so that the signal from the coarse monitor will cause the throw position of switch 108 to be "up" when the battery current polarity is such as to discharge the battery (I..e, the battery is powering a load) and to be "down" when the battery current is off the opposite polarity, all as determined by the coarse monitor.

Figure 4C:
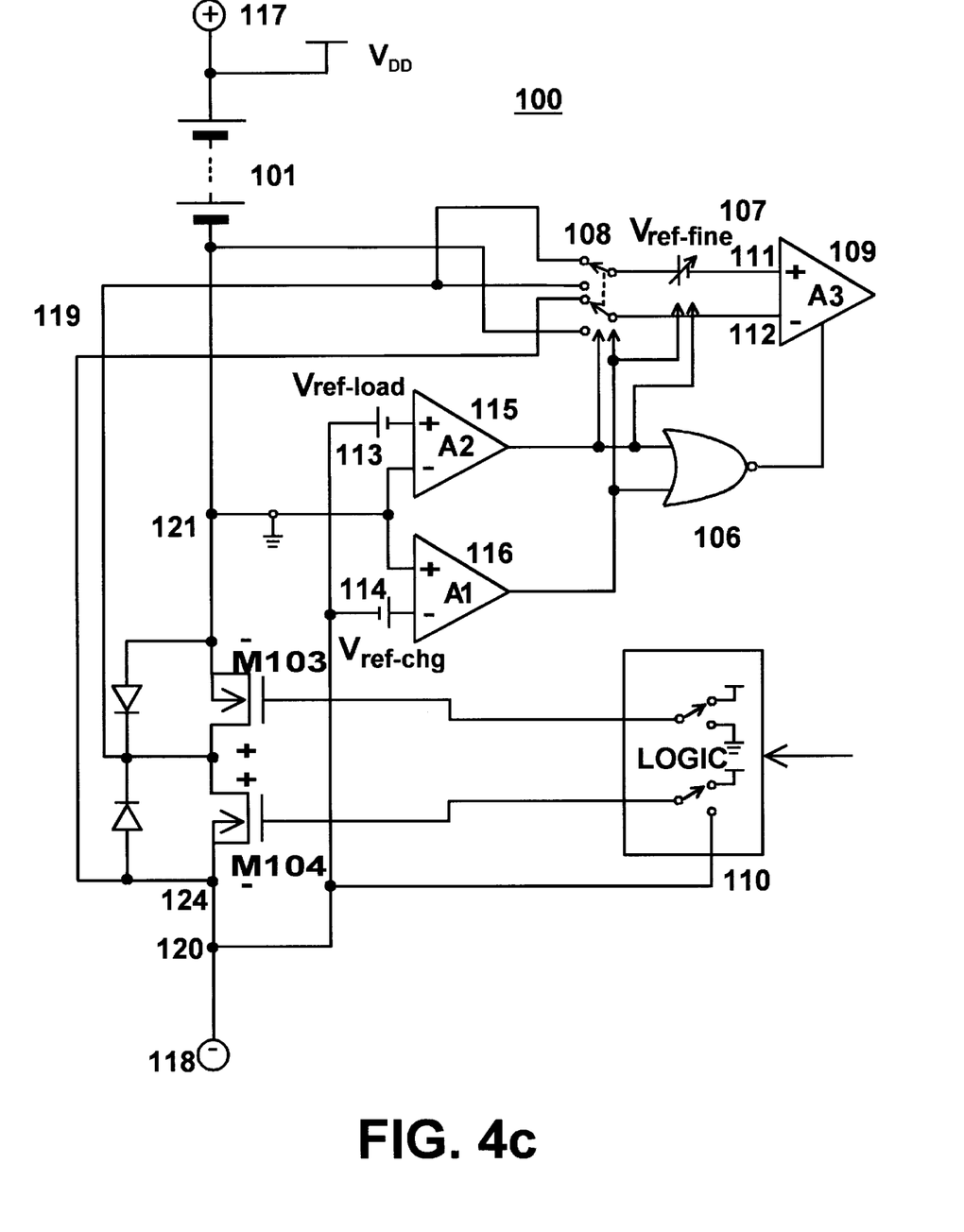
FIG. 4c shows another variation on the PREFERRED EMBODIMENT of the present invention.

FIG. 4c shows yet another variant on the PREFERRED EMBODIMENT of the present invention. It differs from the circuit shown in FIG. 4b in that the two MOSFETs M103 and M104 of the coarse monitor are no longer lumped together. Now, MOSFET M103 is used as the sensing resistor for the load current for both coarse and fine monitoring and MOSFET M104 is used as the sensing resistor for the charging current for both coarse and fine monitoring. The switching between the two MOSFETs is accomplished by switch 108 as controlled by the polarity-sensing coarse monitor.

Generation of Reference Voltages and Temperature Compensation Mechanism

Figure 5A:
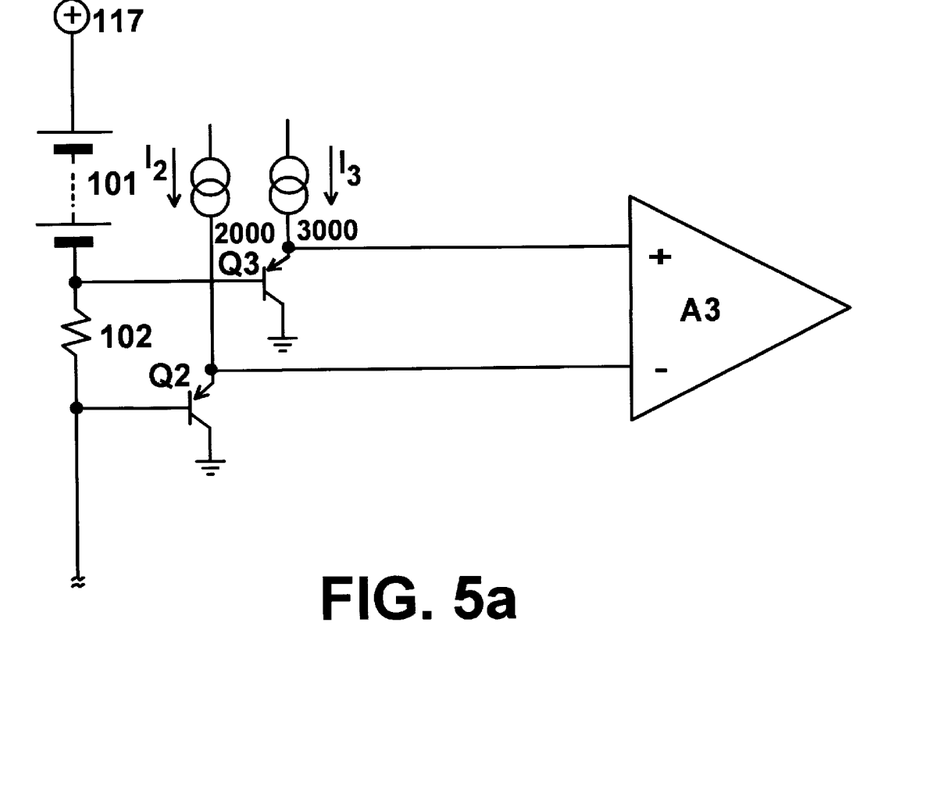
FIG. 5a is a diagram of one sub-circuit for generating the temperature-compensating reference voltages for the fine monitor of the present invention. This is a non-common-mode voltage-input shift.

In one version of the PREFERRED EMBODIMENT, the sensing resistor 102 used in the fine monitor is a piece of standard copper alloy incorporated into the leadframe of the plastic case containing the battery 101 to be protected. Through standard fabrication techniques the length and cross-section of the copper alloy segment are established to a high degree of precision. Since the alloy's resistivity is well-known, this is sufficient to establish the resistance of the sensing resistor 102 with a high degree of accuracy. In the PREFERRED EMBODIMENT of the present invention, all of the battery current passes through the sensing resistor and the resulting voltage drop across it is compared with the reference voltage provided to the comparator A3 used in the fine monitor. Although the temperature dependence of the fine resistor 102 is not zero, it is largely compensated for by the means used to establish the reference voltages. FIG. 5a illustrates the temperature-compensation method of the PREFERRED EMBODIMENT. Although this will be discussed in connection with $V_{ref-fine}$ the same temperature-compensating approach can be used for the reference signals going into the coarse comparators as well. Furthermore, although this discussion is directed to the variant of the PREFERRED EMBODIMENT where the fine sensing resistor is a passive resistor separate from the MOSFETs, it applies equally well to the variants wherein one or both of the MOSFETs are used for the fine sensing resistor as well as for the coarse sensing resistor.

Although constant-current generators are depicted in FIG. 5a, it is not necessary to the operation of this reference voltage generator that constant currents be used, just that the ratio between the currents $I_2$ and $I_3$ remains constant. In the PREFERRED EMBODIMENT of the present invention, it has been observed that the reference voltage produced is essentially unchanged over six orders of magnitude of current density through the pnp transistors Q2 and Q3.

Note that the difference between the respective base-to-emitter voltage drops in the two pnp transistors, Q2 and Q3, is going to establish the reference voltage introduced to the comparator A3. Because of the polarity of the currents produced by the constant current generators 2000 and 3000, the drop across each of the transistors Q2 and Q3 is going to be the voltage drop across a forward-biased pn junction, the pn junction being the emitter-base junction. As is well known, the current through a pn junction is expressible as a function of the voltage drop across that junction and the temperature of the junction in degrees absolute, i.e., in degrees kelvin [K]. The relevant expression is the "diode equation."

$$I = I_o \exp(qV/kT),$$

where $I_o$ depends on the area of the junction and other extrinsic parameters, V is the voltage drop across the junction (positive for a forward-biased junction and negative for a reverse-biased junction), q is the electronic charge [4.8× $10^{-10}$ statcoulombs], k is Boltzmann's constant [1.38×$10^{-16}$ ergs/K], and T is the absolute temperature [K≡°C.+273]. Inverting the relationship, $$V = (kT/q)\ln(I/I_o) = (kT/q)\{\ln I - \ln I_o\}.$$

Since the transistors Q2 and Q3 shown in FIG. 5 are identical, $I_o$ will be the same for both. Nevertheless, since the currents through the two transistors, by design, are different, the voltage drops will be different, resulting in a difference voltage ($\Delta V_{BE}$) being supplied to the fine comparator A3. Note that the polarity of this voltage will depend on the orientation of the switch 108. With it oriented so that both current paths go to ground (as will be the case when the fine monitor is activated) This will be the reference voltage and, from the above equations it is seen to be as follows.

$$\Delta V_{BE} = V_{ref} = (kT/q)(\ln I_2 - \ln I_3) = (kTq)\ln(I_2/I_3)$$

So the reference voltage can be adjusted by adjusting the current ratio. Furthermore, it has a temperature dependence around room temperature (300K) of about one part in 300 (3300 ppm/°C.). Thus, the temperature dependence of the diode-generated reference voltage comes within 10% of completely compensating for the temperature dependence of the precision resistor 102 used by the fine monitor, which is approximately 3000 ppm/°C.) for typical copper alloys used in lead frames. Thus, to first order, the temperature variation of $V_{ref-fine}$ tracks and compensates for the temperature dependence of the fine resistor 102. The temperature of the MOSFETs M103 and M104 is also about 3000 ppm/°C., and so when one or the other of these MOSFETs is used in the "on" state to provide the fine resistance, a similar temperature compensation is effected by the above-described mechanism.

As an example of setting the $V_{ref-fine}$, assume that the maximum safe battery current is 9 A. It is given that the value of the precision resistor 102 in the PREFERRED EMBODIMENT is 4 mΩ at 20° C. (293 K). Thus, the trip voltage across the precision resistor 102 should be 36 mV (0.12 milli-statvolt). The reference voltage biasing the fine comparator must be 36 mV. Substituting in the values for the various constants as given, for the equation above, one sees that the current ratio that must be established is 4.16.

Figure 5B:
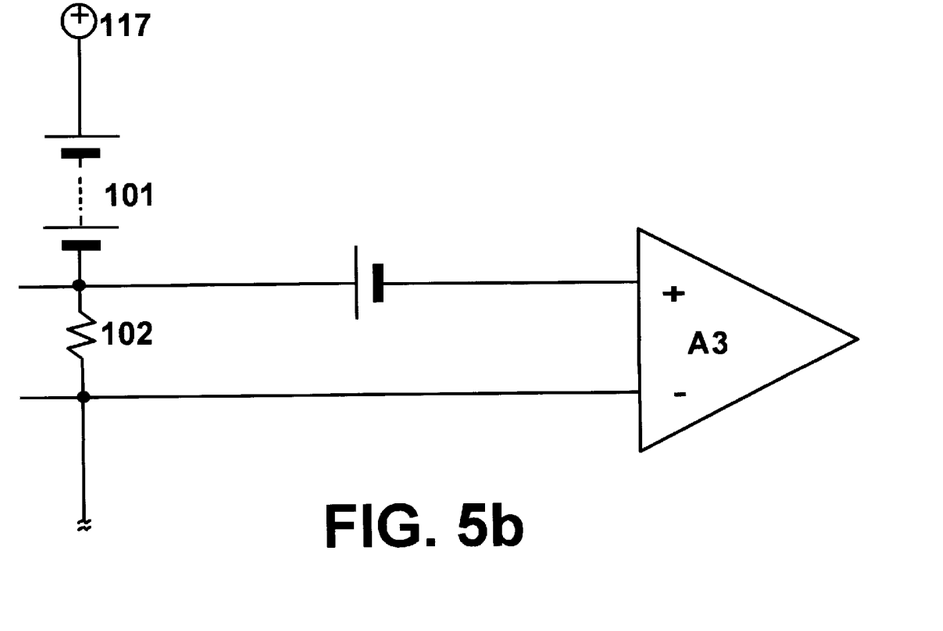

For completeness, FIG. 5b is included to emphasize that the differential reference-voltage circuit of FIG. 5a can be drawn as an equivalent circuit in which a single reference voltage is placed in one input to the fine comparator A3. It is again noted that this is not a common-mode shift that is applied to the fine comparator A3. Indeed, it is a distinct advantage that fine comparator A3 does not have a common-mode-to-GND signal. All of the drawings showing the larger circuit depict $V_{ref-fine}$ as a voltage introduced into one of the two inputs to the fine comparator A3, This is done for convenience and is not meant to indicate that the physical circuit is limited to an arrangement wherein the fine reference voltage is introduced by means only involving one of the inputs to the fine comparator A3. That depiction of where $V_{ref-fine}$ is introduced into the circuit are meant to cover all configurations that are equivalent to that depiction, just as the circuit of FIG. 5b is equivalent to the circuit of FIG. 5a.

Figure 6A:
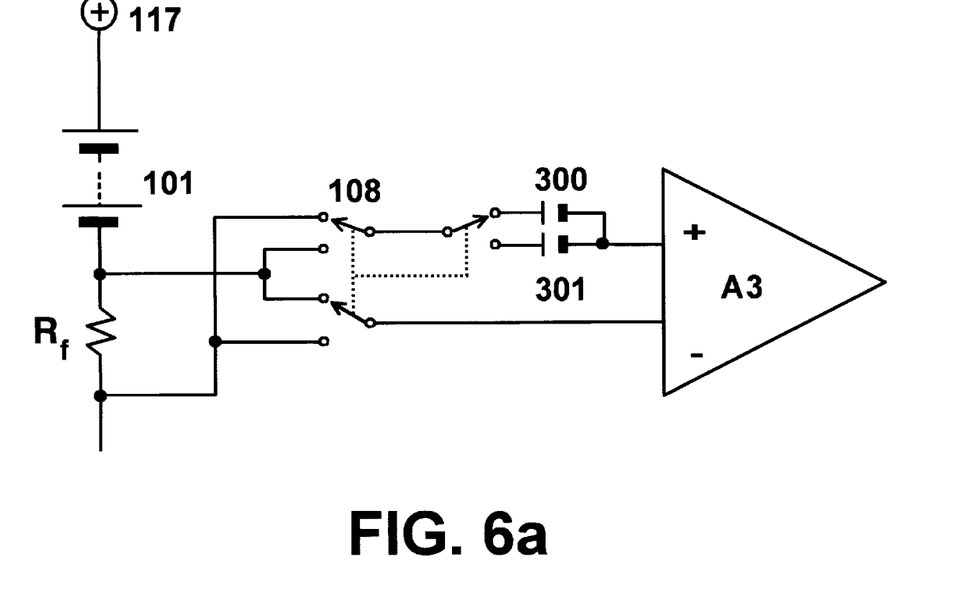
FIG. 6a depicts a way in which the circuit of the present invention can utilize two different reference voltages in the fine monitor, depending on the polarity of the battery current. Here the coarse-monitor-controlled switch is shown in the position corresponding to a battery-charging current.
Figure 6B:
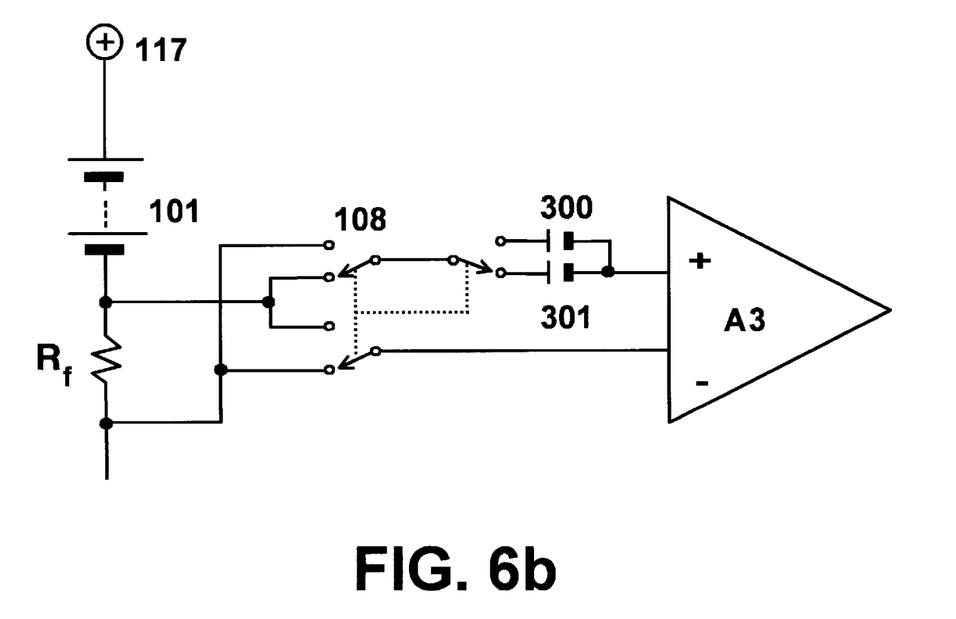
FIG. 6b is the same as FIG. 6a, but shows the switch in the position corresponding to a battery-discharging current.

Finally, for clarity, FIG. 6a and FIG. 6b illustrate the positions of the fine-monitor switches as a function of polarity of the battery current. FIG. 6a shows the switch configuration associated with a charging current. Switch 108 is in the "down" position, and the $V_{ref-fine}$ switch is shown to have chosen reference voltage 300. With this polarity, the upper side (closer to the negative pole of the battery 101) of the fine sensing resistor $R_f$ will be an a higher potential than its lower side FIG. 6b shows the opposite case, where the battery is powering a load.

We claim:

1. A circuit for monitoring current level magnitudes, polarity, or both associated with the charging and discharging of a battery having a positive terminal and a negative terminal, wherein the circuit acts as a switch for interrupting battery current when the battery current exceeds preset levels, the circuit comprising:

a. a first power transistor having a first turn-on resistance, wherein said first power resistor is coupled to the positive terminal of the battery;

b. a second power transistor having a second turn-on resistance, wherein said second power transistor is coupled between said first power transistor and the negative terminal of the battery;

c. a first coarse comparator having a first input coupled between said first power transistor and the positive terminal and a second input coupled between said second power transistor and the negative terminal;

d. a second coarse comparator having a first input coupled between said second power transistor and the negative terminal and a second input coupled between said first power transistor and the positive terminal; and e. a fine comparator activated by an output of either of said first coarse comparator and said second coarse comparator, said fine comparator having a first input coupled to a first resistance terminal of a resistive element and a second input coupled to a second resistance terminal of said resistive element, wherein an output of said fine comparator controls operation of said first power transistor and said second power transistor.

2. The circuit as claimed in claim 1 wherein said first power transistor and said second power transistor are MOS power transistors coupled drain to drain.

3. The circuit as claimed in claim 2 wherein said MOS power transistors are NMOS transistors.

4. The circuit as claimed in claim 1 further comprising a first reference voltage source coupled between the negative terminal and said second input of said first coarse comparator and a second reference voltage source coupled between said negative terminal and said first input of said second coarse comparator.

5. The circuit as claimed in claim 4 wherein said first input of said first coarse comparator is a noninverting terminal and said second input of said first coarse comparator is an inverting terminal, and wherein said first input of said second coarse comparator is an inverting terminal and said second input of said second coarse comparator is a noninverting terminal.

6. The circuit as claimed in claim 5 wherein said output of said first coarse comparator activates said fine coarse comparator only when the current through the battery is of a value that reaches or exceeds a magnitude equivalent to the potential of said first reference voltage source divided by the sum of said first turn-on resistance and said second turn-on resistance, and wherein said output of said second coarse comparator activates said fine coarse comparator only when the current through the battery is of a value that reaches or exceeds a magnitude equivalent to the potential of said second reference voltage source divided by the sum of said first turn-on resistance and said second turn-on resistance.

7. The circuit as claimed in claim 1 further comprising a NOR gate coupling said first coarse comparator and said second coarse comparator to said fine comparator.

8. The circuit as claimed in claim 1 further comprising a fine reference voltage source coupled between said first resistance terminal of said resistive element and said first input of said fine comparator.

9. The circuit as claimed in claim 8 wherein said first input of said fine comparator is a noninverting input terminal and said second input of said fine comparator is an inverting input terminal.

10. The circuit as claimed in claim 9 wherein said fine reference voltage source includes a pair of constant current generators.

11. The circuit as claimed in claim 10 wherein each of said constant current generators includes a bipolar transistor.

12. The circuit as claimed in claim 1 further comprising a switch between said first input and said second input of said fine comparator and said first resistance terminal and said second resistance terminal of said resistive element.

13. The circuit as claimed in claim 1 wherein said resistive element is a precision resistor.

14. The circuit as claimed in claim 13 wherein said precision resistor has a resistance of about 4 mΩ.

15. A method of protecting a rechargeable battery from overcharging or overdischarging, the battery including a positive terminal and a negative terminal, the method comprising the steps of:

a. directing current associated with the battery through a resistive switch coupled between the positive terminal and the negative terminal of the battery;

b. comparing a voltage across said resistive switch with a pair of coarse comparators;

c. controlling activation of a fine comparator with an output of said coarse comparators as a function of said voltage across said switch; and d. controlling operation of said resistive switch with an output of said fine comparator.

16. The method as claimed in claim 15 wherein said resistive switch includes a pair of drain-to-drain power MOS transistors.

17. The method as claimed in claim 16 further comprising the step of triggering operation of said fine comparator by measuring a voltage across a resistive element coupled between the positive terminal of the battery and said power MOS transistors.

18. The method as claimed in claim 17 wherein said resistive element is a precision resistor.

19. The method as claimed in claim 17 further comprising the step of introducing a fine reference voltage source between said resistive element and input terminals of said fine comparator.

20. The method as claimed in claim 19 wherein said fine reference voltage source includes a pair of constant current generators.

* * * * *